United States Patent
Chen et al.

(10) Patent No.: US 8,736,372 B2
(45) Date of Patent: *May 27, 2014

(54) OUTPUT BUFFER OF SOURCE DRIVER

(75) Inventors: Chien-Ming Chen, Tainan (TW);
Yann-Hsiung Liang, Hsinchu (TW);
Hui-Wen Miao, Hsinchu (TW);
Ko-Yang Tso, New Taipei (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 63 days.

This patent is subject to a terminal disclaimer.

(21) Appl. No.: 13/435,322

(22) Filed: Mar. 30, 2012

(65) Prior Publication Data

US 2012/0249244 A1    Oct. 4, 2012

(30) Foreign Application Priority Data

Mar. 31, 2011  (TW) .............................. 100111232 A (51) Int. Cl.
*H03F 3/45* (2006.01)
*G06F 3/038* (2013.01)

(52) U.S. Cl.
CPC .................................. *H03F 3/45183* (2013.01)
USPC ............................................ 330/259; 345/204

(58) Field of Classification Search
CPC ........................................................ H03F 3/45
USPC ............................................ 330/259; 345/204
See application file for complete search history.

(56) References Cited

U.S. PATENT DOCUMENTS 7,567,244 B2 *  7/2009  Nohtomi et al. .............. 345/204
7,821,340 B2 * 10/2010  Lin et al. ....................... 330/264

* cited by examiner

*Primary Examiner* — Robert Pascal
*Assistant Examiner* — Khiem Nguyen (57) ABSTRACT

An output buffer of a source driver is disclosed. The output buffer includes a buffer input, a buffer output, a differential input stage, a bias current source, an output stage, a compensation capacitor, and a comparator. The output stage and the comparator are both operated between an analog supply voltage (AVDD) and a half analog supply voltage (HAVDD), or both operated between the half analog supply voltage (HAVDD) and a ground voltage. The comparator compares an input signal with an output signal and outputs a control signal to the bias current source according to the compared result.

8 Claims, 7 Drawing Sheets

OUTPUT BUFFER OF SOURCE DRIVER

BACKGROUND OF THE INVENTION

1. Field of the Invention

The invention relates to driving circuit; in particular, to an output buffer applied in a source driver of a liquid crystal display.

2. Description of the Prior Art

In recent years, with the continuous progress of display technology, various types of display apparatuses, such as a LCD display and a plasma display, are shown in the market. Because the volume of the LCD display is much smaller the conventional CRT display, the LCD display using smaller desk space is convenient for the people in modern life.

Figure 1:
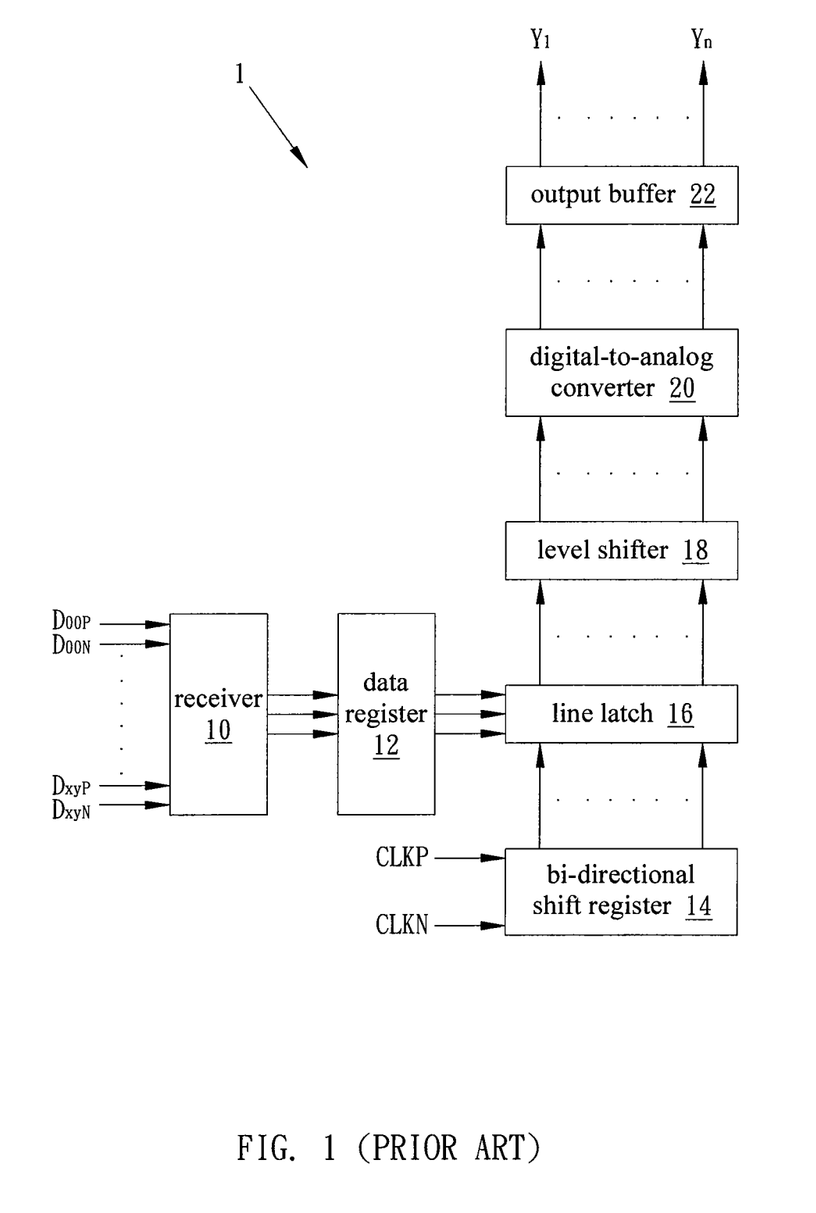
FIG. 1 illustrates a schematic diagram of a circuit structure of a conventional source driver.

In general, the driving apparatus of the TFT-LCD display mainly includes a source driving circuit and a gate driving circuit. For the TFT-LCD display having high quality, high resolution, and low power consumption, the source driving circuit plays a very important role. Please refer to FIG. 1. FIG. 1 illustrates a schematic diagram of a circuit structure of a conventional source driver.

As shown in FIG. 1, the source driver 1 includes a receiver 10, a data register 12, a bi-directional shift register 14, a line latch 16, a level shifter 18, a digital-to-analog converter 20, and an output buffer 22. The main power domain of the source driver 1 includes digital power sources VDD, VSS and analog power sources AVDD, HAVDD, AGND. In general, a plurality of output channels Y1~Yn of the source driver 1 can be divided into the even output channels and the odd output channels. If the output voltages of the even output channels are higher than HAVDD, the output voltages of the add output channels will be lower than HAVDD, and vice versa. This half analog power source structure of the TFT-LCD display can achieve the effect of saving system power consumption.

The output buffer 22 of the source driver 1 is usually realized by an operational amplifier (OPAMP). For the source driver 1 of the TFT-LCD display, its visual performance is determined by the operational amplifier, especially the slew rate which is important to the TFT-LCD display applied in the high frame rate application.

Figure 2:
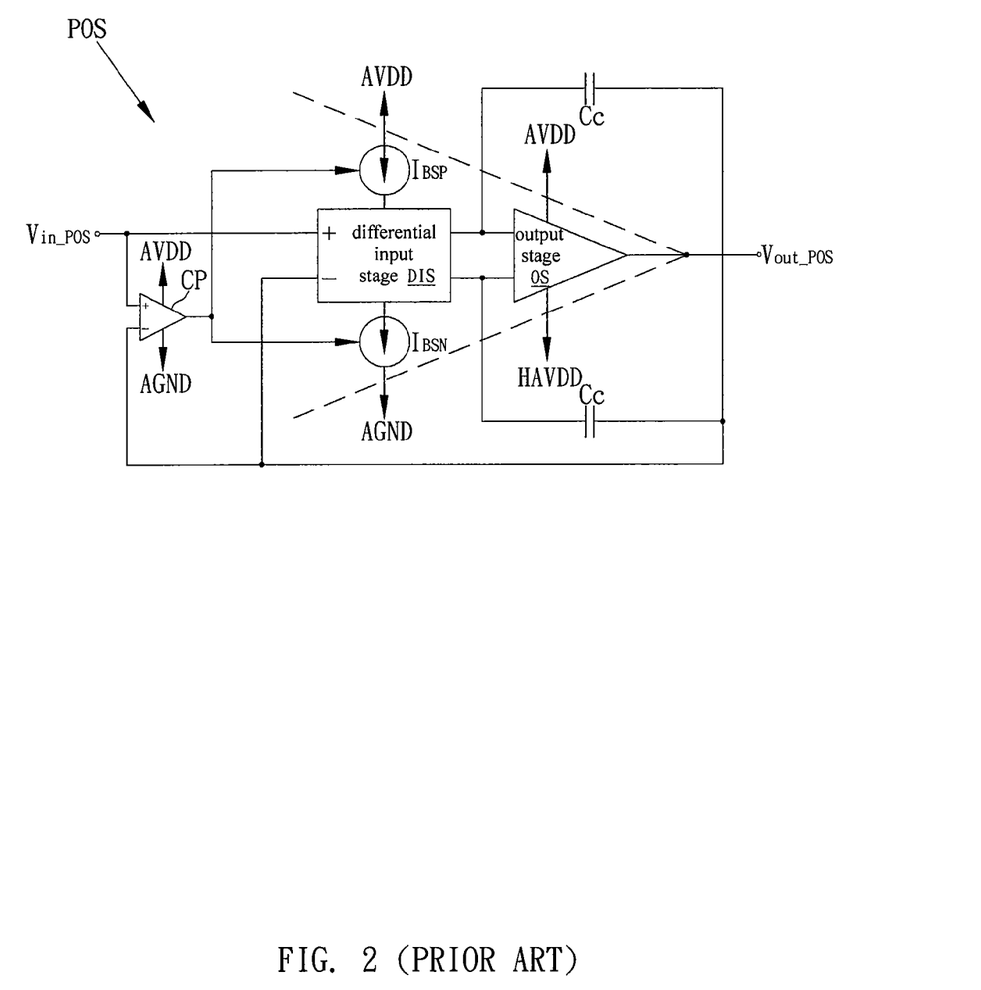
FIG. 2 illustrates a circuit diagram of a conventional operational amplifier with positive polarity operated under a half analog power source.

Please refer to FIG. 2. FIG. 2 illustrates a circuit diagram of a conventional operational amplifier POS with positive polarity operated under a half analog power source. As shown in FIG. 2, the circuit of the operational amplifier POS includes a differential input stage DIS, bias current sources IBSP and IBSN, an output stage OS, a compensation capacitor $C_c$, and a comparator CP. Because the operational amplifier POS with positive polarity is operated under the half analog power source, its input signal $V_{in\_POS}$, output signal $V_{out\_POS}$, and output stage OS have operation voltages between AVDD and HAVDD, and the comparator CP has an operation voltage between AVDD and AGND. And, the comparator CP can be realized by a cascading source follower, as shown in FIG. 3.

Figure 3:
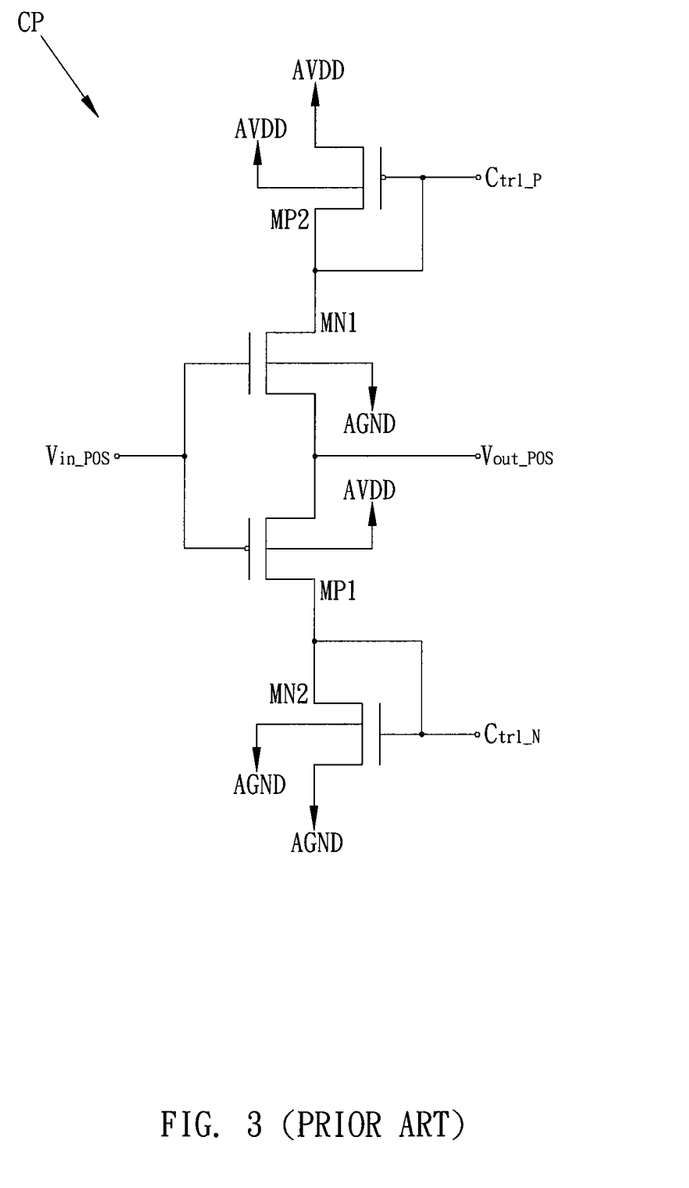
FIG. 3 illustrates an embodiment of the comparator shown in FIG. 2.

As shown in FIG. 3, because the swing level of the input signal and output signal, the NMOS transistor MN1 will suffer body effect more serious than the PMOS transistor MP1 and its threshold voltage will become larger. Therefore, the NMOS source follower will become less sensitive, and the response of the control signal Ctrl_P will be slower than the control signal Ctrl_N to cause the slew rate of output driving and sinking become unbalanced, and the visual performance of the TFT-LCD display will be seriously affected.

Therefore, the invention provides an output buffer applied in a source driver of a liquid crystal display to solve the above-mentioned problems occurred in the prior arts.

SUMMARY OF THE INVENTION

An embodiment of the invention is an output buffer applied in a source driver of a liquid crystal display used for improving the unbalanced slew rate caused by the body effect of the source follower in prior arts to enhance the visual performance of the TFT-LCD display.

In this embodiment, the output buffer includes a buffer input, a buffer output, a differential input stage, a bias current source, an output stage, a compensation capacitor, and a comparator. The output stage and the comparator are both operated between an analog supply voltage (AVDD) and a half analog supply voltage (HAVDD), or both operated between the half analog supply voltage (HAVDD) and a ground voltage. The comparator compares an input signal with an output signal and outputs a control signal to the bias current source according to the compared result.

The advantage and spirit of the invention may be understood by the following detailed descriptions together with the appended drawings.

DETAILED DESCRIPTION

An embodiment of the invention is an output buffer. In this embodiment, the output buffer is applied in a source driver of a TFT-LCD display, but not limited to this.

In this embodiment, the circuit structure of the source driver of the TFT-LCD display can be also referred in FIG. 1. As shown in FIG. 1, the source driver 1 includes a receiver 10, a data register 12, a bi-directional shift register 14, a line latch 16, a level shifter 18, a digital-to-analog converter 20, and an output buffer 22. Wherein, the receiver 10 is coupled to the data register 12; the data register 12 is coupled to the line latch 16; the bi-directional shift register 14 is coupled to the line latch 16; the line latch 16 is coupled to the level shifter 18; the level shifter 18 is coupled to the digital-to-analog converter 20; the digital-to-analog converter 20 is coupled to the output buffer 22.

It should be noticed that the main power domain of the source driver 1 includes digital power sources VDD, VSS and analog power sources AVDD, HAVDD, AGND. Wherein, AVDD represents the analog supply voltage; HAVDD represents the half analog supply voltage; AGND represents the ground voltage. A plurality of output channels Y1~Yn of the source driver 1 can be divided into even output channels and odd output channels. If the output voltages of the even output channels are higher than HAVDD, the output voltages of the add output channels will be lower than HAVDD, and vice versa. This half analog power source structure of the TFT-LCD display can achieve the effect of saving system power consumption.

Since the operations and functions of the receiver 10, the data register 12, the bi-directional shift register 14, the line latch 16, the level shifter 18, and the digital-to-analog converter 20 are the same with those in prior arts, and they will not be described again here. Next, the most important technology feature of the invention, the output buffer 22 of the source driver 1, will be introduced in detail as follows.

Figure 4:
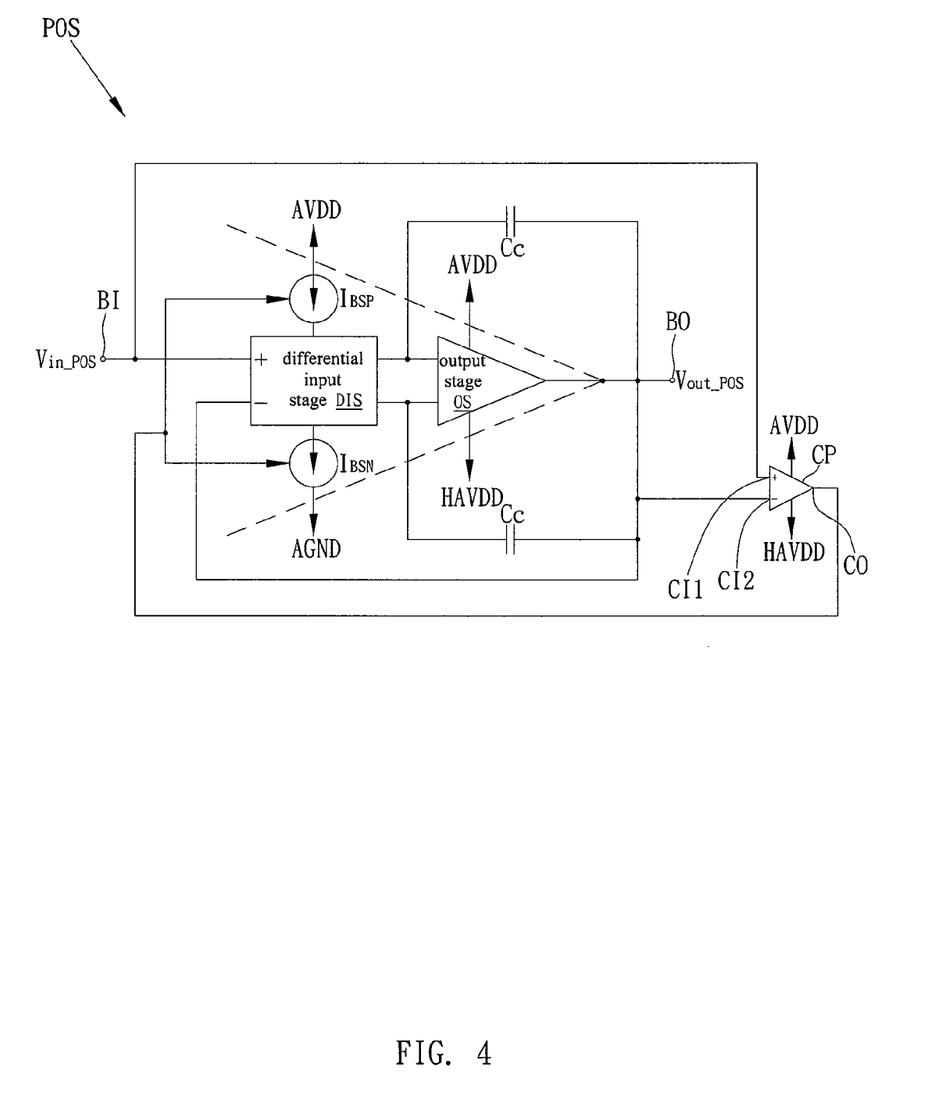
FIG. 4 illustrates a circuit diagram of an operational amplifier with positive polarity operated under a half analog power source.

In this embodiment, the output buffer 22 of the source driver 1 can be realized by an operational amplifier (OPAMP), but not limited to this. Please refer to FIG. 4. FIG. 4 illustrates a circuit diagram of the operational amplifier POS with positive polarity operated under a half analog power source. As shown in FIG. 4, the circuit of the operational amplifier POS includes a buffer input BI, a buffer output BO, a differential input stage DIS, two bias current sources $I_{BSP}$ and $I_{BSN}$, an output stage OS, two compensation capacitors $C_c$, and a comparator CP.

Wherein, the differential input stage DIS is coupled to the buffer input BI; the two bias current sources $I_{BSP}$ and $I_{BSN}$ are both coupled to the differential input stage DIS; the output stage OS is coupled between the differential input stage DIS and the buffer output BO; one end of the compensation capacitor $C_c$ is coupled between the differential input stage DIS and the output stage OS, and the other end of the compensation capacitor $C_c$ is coupled between the output stage OS and the buffer output BO; two comparator inputs CI1 and CI2 of the comparator CP are coupled to the buffer input BI and the buffer output BO respectively, and a comparator output CO of the comparator CP is coupled to the two bias current sources $I_{BSP}$ and $I_{BSN}$.

In this embodiment, the bias current source $I_{BSP}$ is coupled between the differential input stage DIS and the analog operation voltage AVDD in series, and the current outputted from the bias current source $I_{BSP}$ flows toward the differential input stage DIS; the bias current source $I_{BSN}$ is coupled between the differential input stage DIS and the ground voltage AGND, and the current outputted from the bias current source $I_{BSN}$ flows toward the ground voltage AGND. The buffer input BI is used to receive the output signal $V_{in\_POS}$ and transmit the output signal $V_{in\_POS}$ to the differential input stage DIS. After the differential input stage DIS processes the input signal $V_{in\_POS}$, the differential input stage DIS transmits the processed input signal $V_{in\_POS}$ to the output stage OS. After the output stage OS converts the input signal $V_{in\_POS}$ into the output signal $V_{out\_POS}$, the output signal $V_{out\_POS}$ is outputted by the buffer output BO. Because the two comparator inputs CI1 and CI2 of the comparator CP are coupled to the buffer input BI and the buffer output BO respectively, the comparator CP can compare the input signal $V_{in\_POS}$ with the output signal $V_{out\_POS}$ and output a control signal through its comparator output CO to the two bias current sources $I_{BSP}$ and $I_{BSN}$ according to the compared result to control the current outputted from the two bias current sources $I_{BSP}$ and $I_{BSN}$.

As shown in FIG. 4, in this embodiment, it should be noticed that the output stage OS of the operational amplifier POS with positive polarity is operated between the analog operation voltage AVDD and the half analog operation voltage HAVDD, and the comparator CP is also operated between the analog operation voltage AVDD and the half analog operation voltage HAVDD. This is obviously different from the feature that the operation voltage of the comparator CP is between the analog operation voltage AVDD and the ground voltage AGND in prior arts shown in FIG. 2.

Because the operational amplifier POS with positive polarity is operated under the half analog operation voltage HAVDD, the input signal $V_{in\_POS}$, the output signal $V_{out\_POS}$, and the output stage OS will have operation voltages between the analog operation voltage AVDD and the half analog operation voltage HAVDD, and its comparator CP can be realized by a cascading source follower, but not limited to this.

Figure 5:
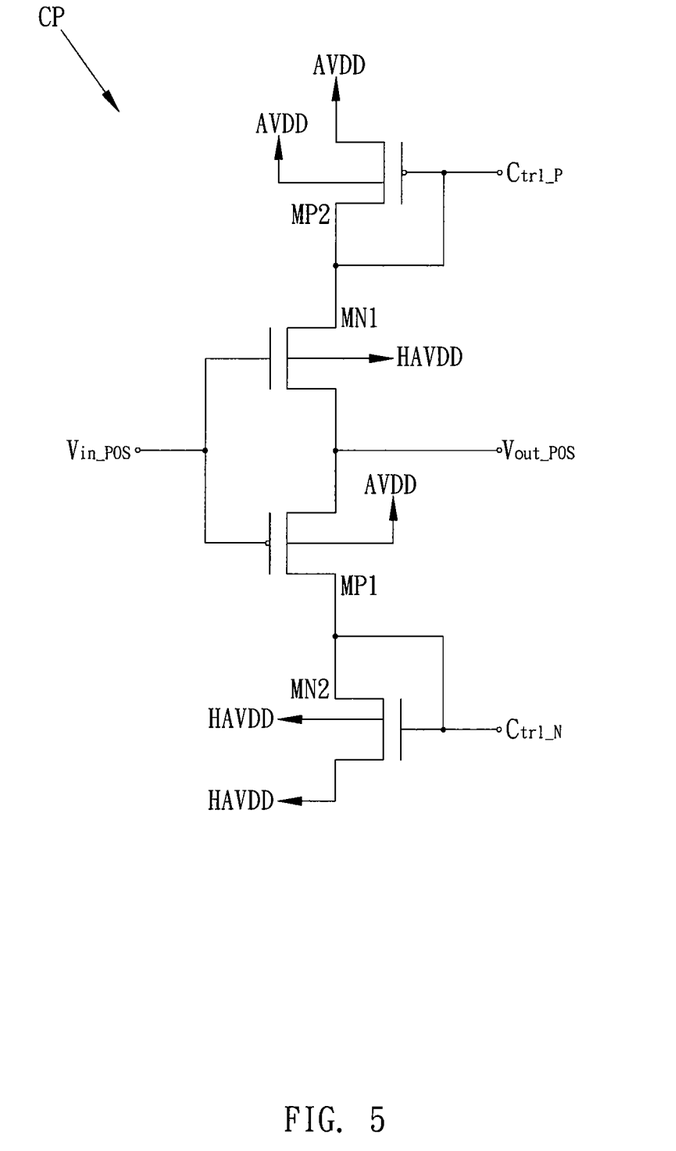
FIG. 5 illustrates an embodiment of the comparator shown in FIG. 4.

Then, Please refer to FIG. 5. FIG. 5 illustrates an embodiment of the comparator CP shown in FIG. 4. As shown in FIG. 5, the comparator CP is realized by a cascading source follower, but not limited to this. In this embodiment, the comparator CP includes not only the two comparator inputs CI1, CI2, and the comparator output CO, but also a first N-type transistor MN1, a second N-type transistor MN2, a first P-type transistor MP1, and a second P-type transistor MP2. In fact, the first N-type transistor MN1 and the second N-type transistor MN2 can be NMOS transistors, and the first P-type transistor MP1 and the second P-type transistor MP2 can be PMOS transistors, but not limited to this.

Wherein, the first N-type transistor MN1 is coupled to the half analog operation voltage HAVDD; the second N-type transistor MN2 is coupled to the half analog operation voltage HAVDD; the first P-type transistor MP1 is coupled between the first N-type transistor MN1 and the second N-type transistor MN2, and coupled to the analog operation voltage AVDD; the second P-type transistor MP2 is coupled between the first N-type transistor MN1 and the analog operation voltage AVDD.

As shown in FIG. 5, in this embodiment, it should be noticed that the power domain of the base PB1 of the first P-type transistor MP1 is the analog supply voltage (AVDD), and the power domains of the base PB2 and the source PS2 of the second P-type transistor MP2 are also the analog supply voltage (AVDD). The power domain of the base NB1 of the first N-type transistor MN1 is the half analog supply voltage (HAVDD), and the power domains of the base NB2 and the source NS2 of the second N-type transistor MN2 are also the half analog supply voltage (HAVDD). This is obviously different from the feature that the power domain of the base NB1 of the first N-type transistor MN1 is the ground voltage AGND and power domains of the base NB2 and the source NS2 of the second N-type transistor MN2 are also the ground voltage AGND in prior arts shown in FIG. 3.

In this condition, if the absolute values of the threshold voltages of the first N-type transistor MN1 and the first P-type transistor MP1 are similar, the body effects acted on the first N-type transistor MN1 and the first P-type transistor MP1 are also similar. Therefore, the source followers of the comparator CP can still maintain their sensitivities, and the responses of the control signals Ctrl_P and Ctrl_N will be identical, so that the slew rates of output driving and sinking will be balanced to reduce the unnecessary power consumption. By doing so, the problem of the unbalanced slew rates in prior arts can be overcome, and the visual performance of the TFT-LCD display can be also largely improved.

Figure 6:
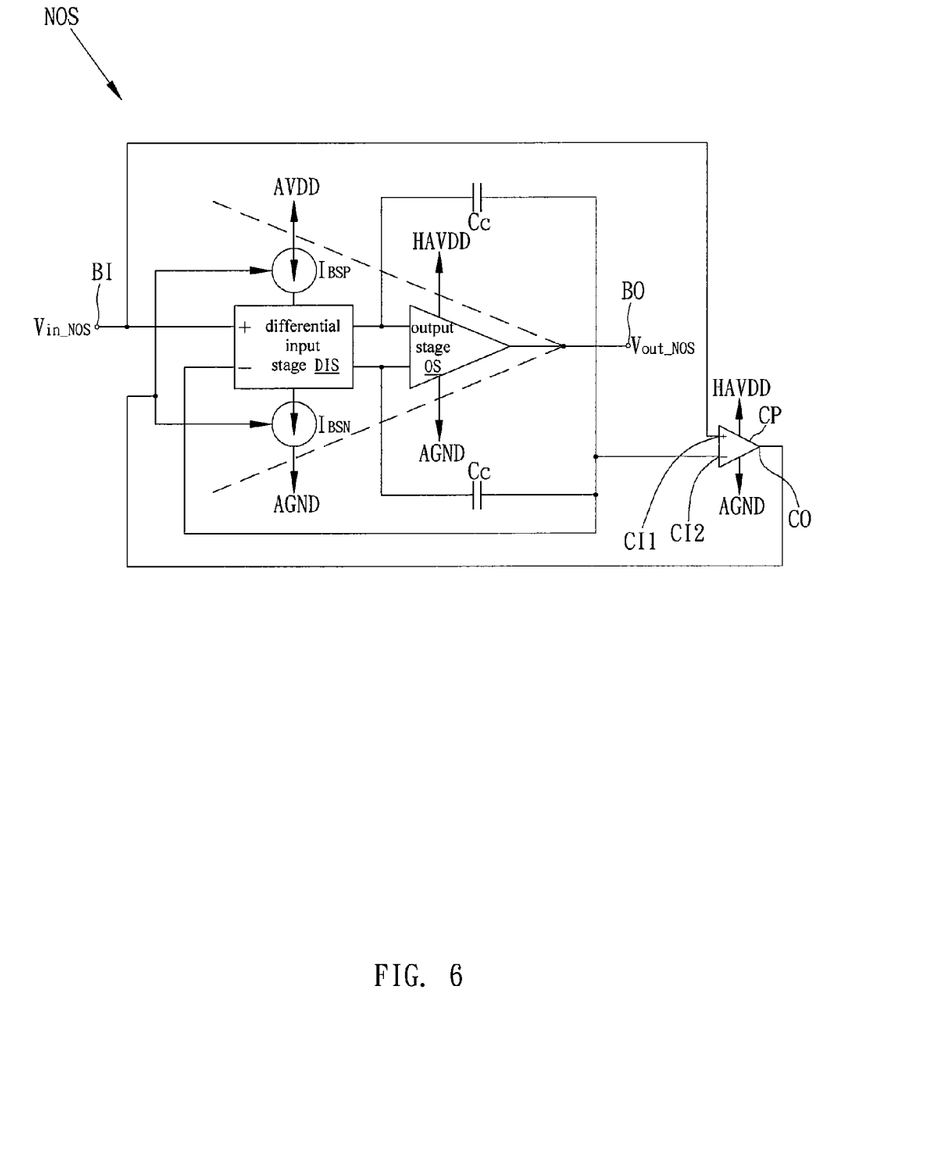
FIG. 6 illustrates a circuit diagram of a negative operational amplifier operated under a half analog power source.

Similarly, the above-mentioned ways can also applied in the operational amplifier NOS with negative polarity. Please refer to FIG. 6. FIG. 6 illustrates a circuit diagram of the operational amplifier NOS with negative polarity operated under a half analog power source. The difference between FIG. 4 and FIG. 6 is that the output stage OS of the operational amplifier NOS with negative polarity is operated between the half analog supply voltage (HAVDD) and the ground voltage (AGND), and the comparator CP is operated between the half analog supply voltage (HAVDD) and the ground voltage (AGND).

Figure 7:
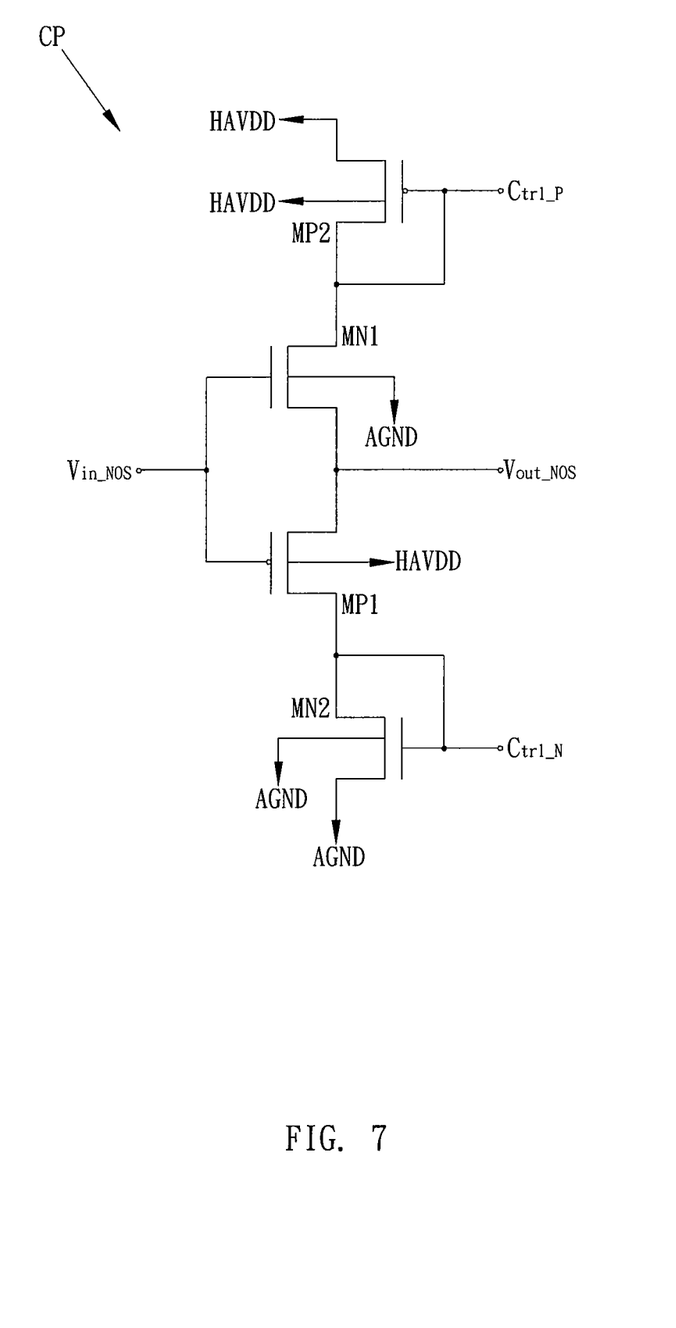
FIG. 7 illustrates an embodiment of the comparator shown in FIG. 6.

Then, Please refer to FIG. 7. FIG. 7 illustrates an embodiment of the comparator CP shown in FIG. 6. As shown in FIG. 7, the comparator CP is realized by a cascading source follower, but not limited to this. In this embodiment, the comparator CP includes not only the two comparator inputs CI1, CI2, and the comparator output CO, but also a first N-type transistor MN1, a second N-type transistor MN2, a first P-type transistor MP1, and a second P-type transistor MP2. In fact, the first N-type transistor MN1 and the second N-type transistor MN2 can be NMOS transistors, and the first P-type transistor MP1 and the second P-type transistor MP2 can be PMOS transistors, but not limited to this.

It should be noticed that the difference between FIG. 7 and FIG. 5 is that the first N-type transistor MN1 of FIG. 7 is coupled to the ground voltage AGND; the second N-type transistor MN2 of FIG. 7 is coupled to the ground voltage AGND; the first P-type transistor MP1 of FIG. 7 is coupled between the first N-type transistor MN1 and the second N-type transistor MN2, and coupled to the half analog supply voltage (HAVDD); the second P-type transistor MP2 of FIG. 7 is coupled between the first N-type transistor MN1 and the half analog supply voltage (HAVDD). The power domain of the base PB1 of the first P-type transistor MP1 of the comparator CP is the half analog supply voltage (HAVDD), and the power domains of the base PB2 and the source PS2 of the second P-type transistor MP2 are also the half analog supply voltage (HAVDD). The power domain of the base NB1 of the first N-type transistor MN1 is the ground voltage (AGND), and the power domains of the base NB2 and the source NS2 of the second N-type transistor MN2 are also the ground voltage (AGND).

In this condition, if the absolute values of the threshold voltages of the first N-type transistor MN1 and the first P-type transistor MP1 are similar, the body effects acted on the first N-type transistor MN1 and the first P-type transistor MP1 are also similar. Therefore, the source followers of the comparator CP can still maintain their sensitivities, and the responses of the control signals Ctrl_P and Ctrl_N will be identical, so that the slew rates of output driving and sinking will be balanced to reduce the unnecessary power consumption. By doing so, the problem of the unbalanced slew rates in prior arts can be overcome, and the visual performance of the TFT-LCD display can be also largely improved.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. An output buffer, applied in a source driver of a liquid crystal display, the output buffer comprising:
    a buffer input, for receiving an input signal;
    a buffer output, for outputting an output signal;
    a differential input stage, coupled to the buffer input;
    a bias current source, coupled to the differential input stage;
    an output stage, coupled between the differential input stage and the buffer output, the output stage being operated between an analog supply voltage (AVDD) and a half analog supply voltage (HAVDD);
    a compensation capacitor, having one end coupled between the differential input stage and the output stage and the other end coupled between the output stage and the buffer output; and
    a comparator, operated between the analog supply voltage (AVDD) and the half analog supply voltage (HAVDD), two comparator inputs of the comparator being coupled to the buffer input and the buffer output respectively, a comparator output of the comparator being coupled to the bias current source, the comparator comparing the input signal with the output signal and outputting a control signal to the bias current source according to the compared result;
    wherein the comparator further comprises:
        a first N-type transistor, coupled to the half analog supply voltage (HAVDD);
        a second N-type transistor, coupled to the half analog supply voltage (HAVDD);
        a first P-type transistor, coupled between the first N-type transistor and the second N-type transistor and coupled to the analog supply voltage (AVDD); and
        a second P-type transistor, coupled between the first N-type transistor and the analog supply voltage (AVDD).

2. The output buffer of claim 1, wherein the power domain of the base of the first N-type transistor is the half analog supply voltage (HAVDD).

3. The output buffer of claim 1, wherein the power domains of the base and the source of the second N-type transistor are the half analog supply voltage (HAVDD).

4. The output buffer of claim 1, wherein the power domain of the base of the first P-type transistor is the analog supply voltage (AVDD), and the power domains of the base and the source of the second P-type transistor are the analog supply voltage (AVDD).

5. An output buffer, applied in a source driver of a liquid crystal display, the output buffer comprising:
    a buffer input, for receiving an input signal;
    a buffer output, for outputting an output signal;
    a differential input stage, coupled to the buffer input;
    a bias current source, coupled to the differential input stage;
    an output stage, coupled between the differential input stage and the buffer output, the output stage being operated between a half analog supply voltage (HAVDD) and a ground voltage (AGND);
    a compensation capacitor, having one end coupled between the differential input stage and the output stage and the other end coupled between the output stage and the buffer output; and
    a comparator, operated between the half analog supply voltage (HAVDD) and the ground voltage (AGND), two comparator inputs of the comparator being coupled to the buffer input and the buffer output respectively, a comparator output of the comparator being coupled to the bias current source, the comparator comparing the input signal with the output signal and outputting a control signal to the bias current source according to the compared result;
    wherein the comparator further comprises:
        a first N-type transistor, coupled to the ground voltage (AGND);
        a second N-type transistor, coupled to the ground voltage (AGND);

a first P-type transistor, coupled between the first N-type transistor and the second N-type transistor and coupled to the half analog supply voltage (HAVDD); and a second P-type transistor, coupled between the first N-type transistor and the half analog supply voltage (HAVDD).

6. The output buffer of claim 5, wherein the power domain of the base of the first N-type transistor is the ground voltage (AGND).

7. The output buffer of claim 5, wherein the power domain of the base of the second N-type transistor is the ground voltage (AGND).

8. The output buffer of claim 5, wherein the power domain of the base of the first P-type transistor is the half analog supply voltage (HAVDD), and the power domains of the base and the source of the second P-type transistor is the half analog supply voltage (HAVDD).

* * * * *